United States Patent
Khan et al.

(10) Patent No.: US 8,214,545 B2
(45) Date of Patent: Jul. 3, 2012

(54) MULTI-FUNCTIONAL USB APPARATUS WITH AUTO-CONFIGURATION AND USB BATTERY CAP

(75) Inventors: Mohammad Ayub Khan, Santa Clara, CA (US); Muhammad Israr Khan, Islamabad (PK); Shahid Iqbal, Islamabad (PK); Haroon ur Rashid, Islamabad (PK); Ahmad Hassan, Islamabad (PK); Abid Khan, Islamabad (PK)

(73) Assignee: Streaming Networks (Pvt) Ltd., Islamabad (PK)

( * ) Notice: Subject to any disclaimer, the term of this patent is extended or adjusted under 35 U.S.C. 154(b) by 0 days.

(21) Appl. No.: 12/852,493

(22) Filed: Aug. 8, 2010

(65) Prior Publication Data

US 2011/0040901 A1     Feb. 17, 2011

Related U.S. Application Data

(60) Provisional application No. 61/274,150, filed on Aug. 12, 2009.

(51) Int. Cl.
*G06F 3/00* (2006.01)
(52) U.S. Cl. .......... 710/10; 710/14; 710/15; 710/19
(58) Field of Classification Search ......... 710/303, 710/14, 15, 19
See application file for complete search history.

(56) References Cited

U.S. PATENT DOCUMENTS

| | | | |
|---|---|---|---|
| 7,617,342 B2 * | 11/2009 | Rofougaran | 710/100 |
| 2002/0149695 A1 * | 10/2002 | Kayanuma | 348/375 |
| 2003/0011705 A1 * | 1/2003 | Nakatsu et al. | 348/375 |
| 2004/0264614 A1 * | 12/2004 | Tinker | 375/355 |
| 2007/0242838 A1 * | 10/2007 | Ichinose | 381/107 |
| 2008/0055419 A1 * | 3/2008 | Ito | 348/207.99 |
| 2008/0320200 A1 * | 12/2008 | Pederson et al. | 710/305 |
| 2009/0144456 A1 * | 6/2009 | Gelf et al. | 710/8 |
| 2009/0276068 A1 * | 11/2009 | Morohoshi et al. | 700/94 |
| 2010/0146307 A1 * | 6/2010 | Griffin et al. | 713/300 |
| 2010/0299712 A1 * | 11/2010 | Austin et al. | 725/81 |

OTHER PUBLICATIONS

Fowler, Charging batteries from USB, Feb. 2006, Battery power, vol. 10, pp. 1-3.*

* cited by examiner

*Primary Examiner* — Ernest Unelus
(74) *Attorney, Agent, or Firm* — Creso Legal; Firasat Ali

(57) ABSTRACT

The present invention describes a multi-module USB system consisting of a multi-function USB apparatus and associated USB cap. The multi-function USB apparatus operates as a USB host as well as a USB client. The USB cap houses a rechargeable battery pack and when docked with the multi-function USB apparatus provides power to the multi-function USB apparatus. The multi-function USB apparatus and USB cap can also operate independently. The USB system is a multi-functional device having modes that embody, including recording, sharing, playback, storage, and charging battery of USB based portable media devices. Further, the USB system configures itself automatically for the various modes based on use of its interfaces with no specific settings required from the user.

34 Claims, 6 Drawing Sheets

MULTI-FUNCTIONAL USB APPARATUS WITH AUTO-CONFIGURATION AND USB BATTERY CAP

CROSS REFERENCE TO RELATED APPLICATIONS

This application claims the priority benefit of U.S. Provisional Application No. 61/274,150 entitled "Multi-Functional USB device with auto configuration," filed on 12 Aug. 2009, which is incorporated herein by reference.

TECHNICAL FIELD

The present invention generally relates to Universal Serial Bus (USB) devices. More specifically, the present invention is in the technical field of USB based media processing systems.

BACKGROUND

Universal Serial Bus (USB) over the recent years has become a very popular interface standard for communication between host and external devices. This is primarily due to the hot swapping and plug and play feature of the USB which brings ease of use. USB was initially designed for computers to connect peripherals such as mouse, keyboard, printer, and flash drives. However, it has now become a de-facto standard on numerous electronic devices such as cell phones, smart phones, personal media players, webcams, digital cameras and USB hard drives.

A USB connection is between a USB host and a USB client device. An example is the computer which is a host and a USB flash drive which is a client. The two are connected physically through a receptacle (socket) and plug arrangement whereby a USB client has a plug type connector and USB host the corresponding socket type connector. The host side connector, being a socket, is normally covered, for example USB host ports in a computer. Whereas, the plug connector of a USB flash drive needs to be exposed so it can be plugged into a host socket. A USB cap is used to cover the exposed part of the plug connector, when not in use. The USB cap is a passive part made usually of plastic or metal. One shortcoming with existing USB devices is that aside from covering the plug connector, the USB cap does not provide any other function and hence it is an underutilized part of the USB configuration. If the cap can be made to provide additional function(s) it can enhance the benefit of the overall USB system.

Nowadays, a portable USB device usually exhibits a number of additional functions beside its primary purpose. For example, a USB based MP3 player may also be a FM radio receiver and may also be used as a USB flash drive for storage. However, a drawback of these existing multi-function USB devices is that they usually require a complex selection mechanism for configuring the device to operate in a particular mode. The mechanism can be cumbersome and use buttons or combination of buttons and a menu system. For example, the user on powering the unit may need to look up at options available on a small LCD display, scroll the list up/down or left/right and then select the desired mode. This selection process thus can be awkward and difficult at times. Since, the size of USB devices is small it is desired that the mode selection method of a multi-function USB device is as simple as possible with minimum user intervention.

It is frequently desired by users to transfer media contents such as music tracks or photographs from one portable device to another to share them with friends and family members. However, the current sharing process is often time consuming and usually involves a computer in-between. For example, if a person wants to share music on his USB based MP3 player with a friend who has an iPod.RTM., the MP3 player first needs to be connected to a computer. The songs are then copied from the MP3 player to a particular location or directory in the computer, and are finally synced to the iPod using media management software such as iTunes. Such a process for sharing media content adds complexity and limitation to the portable USB device since it cannot be used outside of the computer environment. Therefore, there is a need for a portable device which has a simple mechanism for instant media sharing.

SUMMARY

A USB system consisting of a multi-function USB apparatus and a USB cap is disclosed.

In one embodiment of the invention, the USB cap can be used as a power source. It houses a rechargeable battery pack, power management circuitry and a USB socket connector. When attached to a USB device, such as the disclosed multi-function USB apparatus, the USB cap can provide power to the USB device for its operation. The USB cap can also be used for charging the battery of a USB based media device such as a potable media player (PMP). In another embodiment, the USB cap, when not providing power, can be used as a means for covering and protecting the USB plug connector of a USB device, such as the USB apparatus of the invention.

The multi-function USB apparatus, in one embodiment, is designed in shape and proportion of a USB flash drive. It contains a separate USB client port (plug connector) at one end and a separate USB host port (socket connector) at the other end. The apparatus functions as a USB host as well as a USB client device. In one instance, the USB host port is used for directly recording to external USB clients such as iPhone.RTM., iPod, iPad.RTM., PSP as well as USB flash drives and hard disks. The USB client port of the USB apparatus is used to connect to USB hosts such as a computer and is also used as a power receptacle for powering the apparatus. The multi-function USB apparatus has on-board local storage, on-board microphone and a miniature video camera, beside several interfaces for coupling with external devices. A single main button controls the various operations of the apparatus, for example to start/stop recording.

The USB apparatus of the invention is a multi-functional device. In one embodiment it is an audio recorder and/or video recorder. The input signal is digitized (if required), compressed and stored to the local storage of the USB apparatus or directly to the storage space of an external USB device, which may be attached to the USB host port of the apparatus.

In another embodiment, the invention is a portable media kiosk (content sharing function) whereby contents of the local storage can be transferred to an attached USB device. In yet another embodiment, the apparatus is a media player. It can play the locally stored contents or contents from an external USB device connected to the USB host port.

In yet another embodiment, the invention can be attached to a computer to act as a USB flash drive for data transfer. While connected to a computer, it can also be configured in recording mode to record audio broadcasts such as internet and radio. In another embodiment, the invention can appropriately prepare audio/video data for streaming to a remote station via a computer. In yet another embodiment, the invention can charge the battery of the attached portable media player while recording is in progress or otherwise.

The invention configures itself automatically into various operational modes with no specific settings required from the user. The USB system intelligently exhibits a particular functionality depending upon the connection to its input/output interfaces and upon activation of the record button. For example, when none of the external interfaces are used, the apparatus can record audio using the on-board microphone to its internal storage upon pressing the record button. If only an external USB based media player or storage device is attached to the USB host port of the USB apparatus, it configures itself as a media-kiosk, ready to share the internal contents. Upon pressing the record button the internally stored contents get automatically transferred to the storage of an external USB device attached to it. Similarly, for other supported modes no explicit user setting is required and selection is solely based on input/output interface connections at the time.

The advantages of the present invention include, without limitation, having a replaceable USB cap acting as a power source, a simple way of configuring the system into various functions with no specific selection required from the user, and the portable kiosk mode that enables sharing of files in an easy manner with friends and family.

Yet another advantage of the present invention includes having the multi-functionality of an electronic storage, music and voice recording, media kiosk, audio/video streaming, built-in microphone and camera, and a battery charger all in one USB apparatus.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

The foregoing summary, as well as the following detailed description, will be better understood when read in conjunction with the appended drawings. For the purpose of illustrating the invention, there are shown in the drawings examples that are presently preferred. It should be understood, however, that the invention is not limited to the precise arrangements and instrumentalities shown in the drawings.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details.

Figure 1:
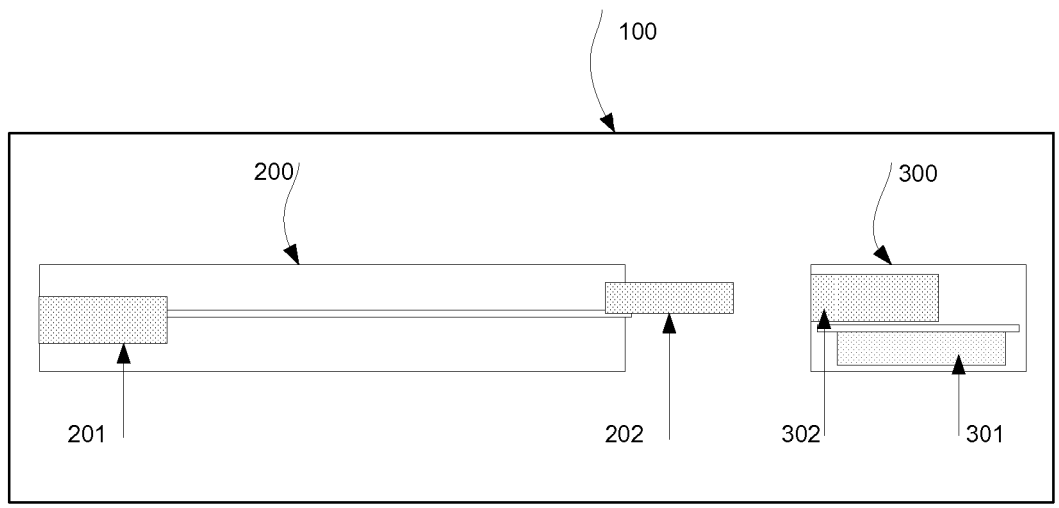
FIG. 1 is a side view of the USB apparatus and USB cap (which includes a rechargeable battery) of the present invention.
Figure 2:
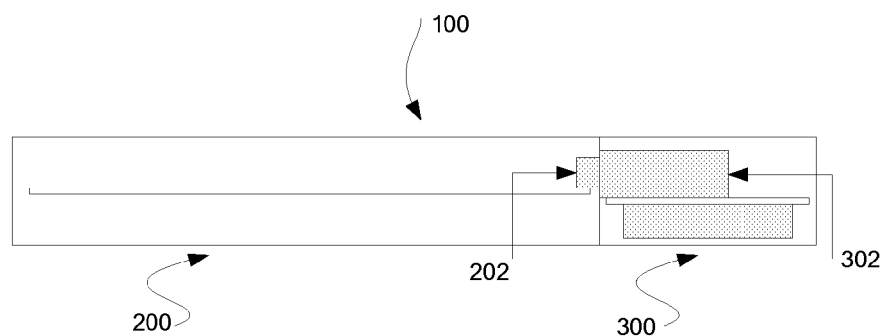
FIG. 2 is a side view of the USB system of the present invention with the USB apparatus plugged into the USB cap.

One or more embodiments of the present invention will now be described. In one embodiment, the USB system 100 consists of a USB apparatus 200 and a USB cap 300. FIG. 1 and FIG. 2 show side views of one embodiment of the USB system 100.

Referring to FIG. 1, the USB apparatus 200 comprises a USB host port 201 (USB socket connector) and a USB client port 202 (USB plug connector). The USB cap 300 houses a power module 301 (rechargeable battery along with power management circuitry) and USB socket connector 302. The USB apparatus 200 and the USB cap 300 are displayed, in FIG. 1, in a detached position. In its detached position, the USB apparatus 200 and the USB cap 300 can be used individually and separately. The USB apparatus 200 can be operated through an external power source, other than the USB cap 300. The USB cap 300 can in turn be used to provide power to other USB devices similar to the USB apparatus 200.

FIG. 2 shows a side view of the USB system 100 in which the USB apparatus 200 is coupled with the USB cap 300. Coupling may be a direct connection which allows a direct structural and electric contact between the USB apparatus 200 and the USB cap 300. Alternatively, the coupling may allow intervening elements that allow structural stability and electronic communication between the USB apparatus 200 and the USB cap 300. In one embodiment, the USB cap 300 may provide power to the USB apparatus 200 for its operation. In yet another embodiment, the USB apparatus 200 may utilize USB cap 300 as a protective cover for its USB plug connector from outside elements, e.g., debris.

Figure 3A:
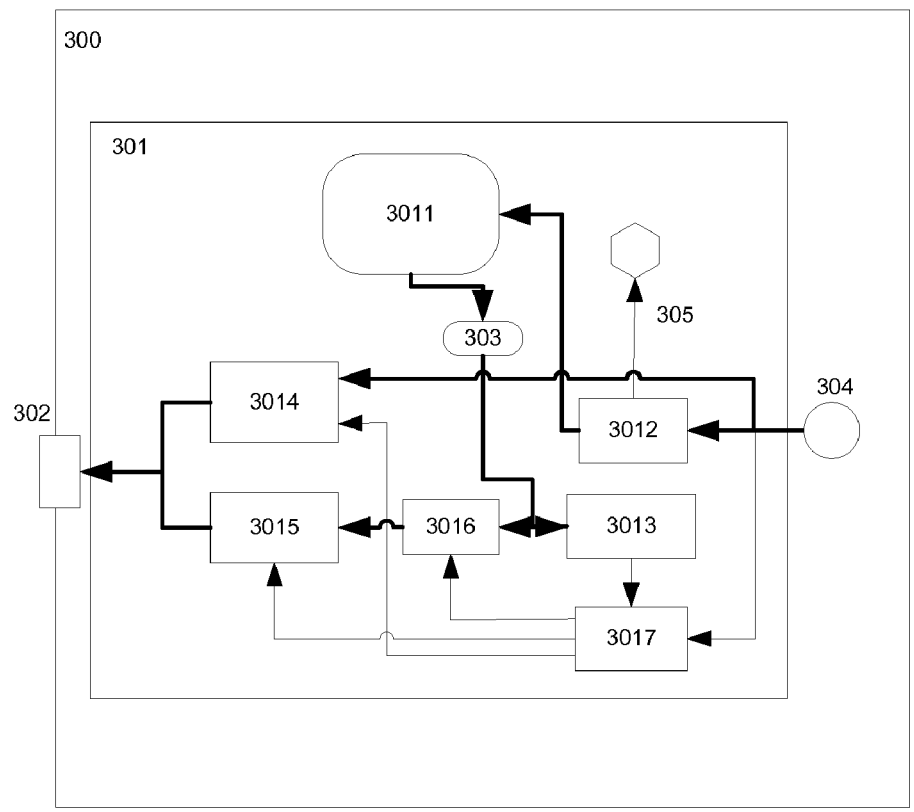
FIG. 3a is a functional block diagram of the USB cap of the present invention

FIG. 3a is a block diagram showing functional details of the power module 301 of the USB cap 300. The power module 301 consists of a rechargeable battery pack 3011 and associated power management circuitry. The battery 3011 is a rechargeable battery of the type lithium-ion or the likes. In one embodiment, the power management circuitry includes that of a battery charger 3012, low voltage detector 3013, battery bypass switch 3014, battery power switch 3015, voltage boost regulator 3016, and control circuitry 3017.

The power is made available, by the USB cap 300, at the power pins of USB socket 302, either through the rechargeable battery 3011 or through an external DC power adapter coupled to the power jack 304. The battery bypass switch 3014 gets activated when an external DC power adapter is detected by the control circuit 3017. The bypass switch 3014 routes the DC power from the external power adapter to the USB socket 302 power pins, while the power from the battery is cut-off by the battery power switch 3015. The external DC power adapter in this instance also starts charging the battery 3011 through the battery charger circuit 3012. The LED 305 indicates charging and functional status of the battery. In one embodiment, for example, red light indicates that charging is in progress, whereas green light indicates that the battery has been fully charged. The orange illumination points to bad battery status indication for the rechargeable battery to be replaced. Alternatively, other colors or indication mechanisms for battery charge and working status are also contemplated.

The switch 303 is the main power on/off switch controlling power both from the battery and external power adapter through the control circuit 3017. When in on-position and no external DC power adapter is connected and battery voltage is above a working threshold, the low voltage detector 3013 detects the voltage from the switch 303 and signals the control circuit 3017 to turn on the battery power switch 3015 which lets the battery voltage through to the power pins of USB socket 302. In one embodiment, a voltage boost regulator 3016 is employed. The voltage boost regulator 3016 converts the battery voltage to the standard USB voltage for USB devices that must operate in narrow operating voltage range of standard USB voltage. In another embodiment, for USB devices that can operate in a wide operating voltage range, the voltage boost regulator 3016 is eliminated or not populated on the power module 301. The battery voltage is monitored by the low voltage detector 3013 and once the battery voltage drops below a working threshold the control circuit 3017 is signaled and it in turn signals the battery power switch 3015 to cut-off the battery power to the USB socket 302 power pins.

Figure 3B:
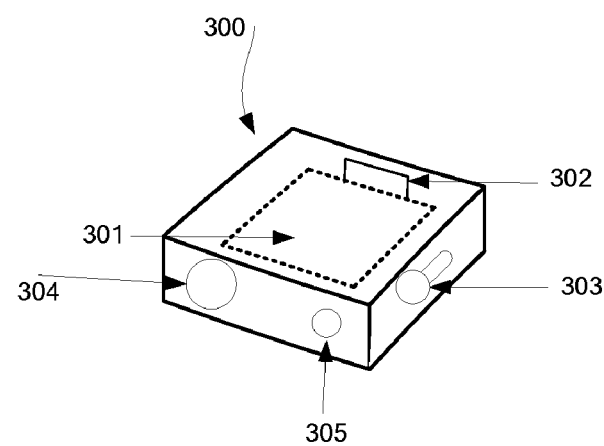
FIG. 3b is an isometric view of the USB cap of the present invention.

FIG. 3b is an isometric view of one embodiment of the USB cap 300. The power module 301 consists of a small printed circuit board (PCB) housing a rechargeable battery 3011 and power management circuitry of FIG. 3a. The USB socket 302 of the USB cap 300 is used for mechanical and electrical connection with a USB device such as the USB apparatus 200. The power switch 303 turns the power ON or OFF at the USB socket 302 power pins. The power jack 304 is for connecting an external DC power adapter to the USB cap 300. The external DC power adapter recharges the battery of the USB cap 300 and is also an alternative power source for the downstream USB device. The LED 305 indicates charging status of the battery. In another embodiment, the USB cap 300 circuitry can also include a microcontroller with built-in USB host port. The microcontroller can enable the USB cap 300 to operate as a USB host for communicating with the downstream USB device, besides controlling the power.

The USB cap 300 provides power, to a plugged in USB device such as the USB apparatus 200, via power pins of the USB socket 302 when power switch 303 is in on-position. When switch 303 is in off-position, power is not supplied to the attached USB device and the USB cap 300 in this instance is just a USB cap, for covering the plug of a USB device such as the USB apparatus 200.

During operation, if the battery voltage of the USB cap 300 falls below a working threshold, the power module 301 cuts off power to the USB socket 302. However, before doing that, at a predetermined voltage above the low voltage threshold, the USB apparatus 200 is informed of the low voltage situation through a number of means of signaling. In one embodiment, signaling through hardware is made using the data lines of the USB socket 302. A USB socket has two data lines marked D+ and D− that are used for signaling and data transfer between a USB host and a client device. As per USB standard, when a USB client device connects to a USB host, it pulls one of the USB data line high (to the system power level through a resistor) to signal its presence to the USB host. Similarly, a USB host pulls the data lines low (to the ground voltage level through a resistor) to signal a USB reset condition to a USB client device. When the USB apparatus 200 is coupled to the USB cap 300, the USB D+ data line is pulled high following the USB standard. Prior to battery voltage falling below the predetermined threshold, the voltage detection circuitry in the USB cap 300 pulls the D+ data line low to generate a reset condition on the USB data bus, as per USB standard. The USB apparatus 200 detects the USB reset condition and interprets it as low battery indication and prepares to stop its current operation so that its power source can be replaced.

In another embodiment, the battery low indication can be given through a warning LED 210 in which case the user can stop current operation of the USB apparatus 200 manually, so that another power source can be attached to the USB apparatus 200. In yet another embodiment, the power module 301 circuitry can also include a microcontroller with a built-in USB host port such that USB cap 300 becomes a USB host. The low battery indication can thus be communicated to the downstream USB device using USB data lines as per USB software protocol.

The USB apparatus 200, on receiving the low battery alert signal, automatically stops its current operation and prepares for possible shutdown before the battery voltage reaches a non-working lower limit. The halted operation however, can be continued immediately by attaching another battery cap of the variety of USB cap 300, or an external DC power adapter. The USB apparatus 200 contains a short duration backup power source (e.g., super capacitor) that keeps the device powered up, to prevent data loss, while the user removes the discharged USB cap 300 and replaces it with a new one. This allows uninterrupted device operation during power source replacement. If a new power source is not plugged in, the USB cap 300 will automatically turn off the power after a predefined interval.

In another embodiment, the USB cap 300 can be used to charge battery of USB based portable media players (PMP). A PMP is attached to the USB socket 302, and charging occurs either through the USB cap 300 battery power or through an external DC power adapter attached to the power jack 304 of the USB cap 300.

An advantage of the present invention of removable USB cap 300 is that it allows a user to use multiple USB caps. Since each USB cap 300 acts as a power source/battery charger, having multiple USB caps provides a user with additional battery charging capacity or an increase in operating time of the downstream USB device being powered. As soon as one USB cap battery goes low, another can be plugged in to allow uninterrupted operation of a USB device.

Figure 4:
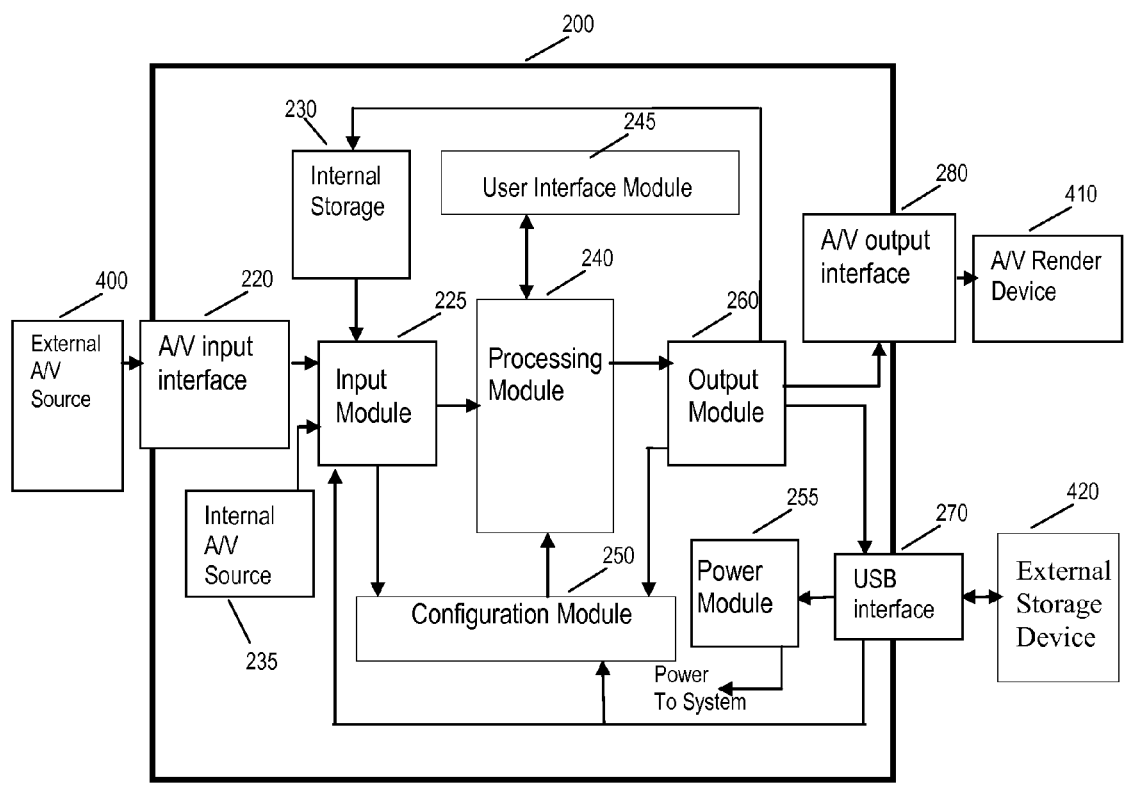
FIG. 4 is a functional block diagram of the USB apparatus of the present invention.

Referring now to FIG. 4, which shows a functional block diagram of the USB apparatus 200. In one embodiment, the USB apparatus 200 comprises of an A/V input interface 220, an input module 225, a storage module 230, internal A/V source module 235, a processing module 240, a user interface module 245, a configuration module 250, a power module 255, an output module 260, USB interface 270, and an A/V output interface 280. As will be further described below, the USB apparatus 200 facilitates a number of functions including, recording, playing and sharing of audio, video and general data.

Referring still to FIG. 4, the input module 225 is configured to receive audio/video (A/V) contents in analog or digital form. The audio and/or video input can be received via A/V input interface 220 from an external A/V source 400; from the internal A/V source 235; from the internal storage module 230 or an external storage device 420 connected via the USB interface 270. The processing module 240 can be configured to encode or transcode (decode/encode) the A/V contents received from the input module 225 to a desired format. The processing module 240 can also be configured to decode the A/V contents received from the input module 225. Furthermore, the processing module 240 can be configured to facilitate automatic transfer of contents of the internal storage 230 to an external storage device 420 via the USB interface 270. The output module 260 is configured to move the received data to a storage media. The storage media can be the internal storage 230 built-in to the USB apparatus 200 (for example, flash memory) or an external storage device 420 attached via the USB interface 270. The external storage device 420 may comprise of a portable media player, a hard disk, a compact flash, a secure digital (SD) card, a multi-media card, a memory stick, a flash drive or any other similar storage medium. The output module 260 can also be configured to provide decoded A/V contents in appropriate form to an external render device 410 via the A/V output interface 280.

As noted above, in one embodiment, the USB apparatus 200 receives A/V contents in analog/digital form from an external input source 400 or internal A/V input source 235, built-in to the USB apparatus 200. The external A/V input source 400 may include a CD/DVD player, an LP player, a cassette player, a computer, set top box, a TV set, a video camera or any other such media devices. The internal A/V input source 235 may include a built-in microphone, a miniature video camera and the likes. In the case of analog A/V signal input, it is captured by the input module 225 and suitably processed and digitized before passing onto the processing module 240.

The processing module 240 receives data from the input module 225. The processing module 240 may be configured to handle any suitable audio and/or video compression method as provided by, for example, AAC, MP2, MP3, AC-3, FLAC, WAV, MPEG1/2/4, H.263, H.264 standards, or any other standard or proprietary compression algorithm. In one embodiment, the processing module 240 compresses the audio and/or video contents into a desired format and passes them onto the output module 260.

The output module 260 transfers and stores the compressed A/V contents to the internal storage memory 230 or directly to the memory associated with the external device 420 attached via the USB interface 270. The external device can be a portable media player in which case the A/V content may be stored by the output module 260 in playback ready form, in format supported by the portable media player. The output module 260 may also transfer the compressed A/V contents to a general purpose storage device other than the portable media player. The output module 260 may employ any wired or wireless means under a suitable protocol or standard for data transfer.

In another embodiment, the input module 225 receives compressed or uncompressed A/V contents in digital form from an external A/V source 400 or from the internal storage media 230. The input module 225 may also receive such a data in a wired or wireless means via the USB interface 270 from external storage media 420. In one embodiment, the processing module 240 decodes the compressed data and passes the uncompressed data to the output module 260 for playback through the external render device 410. In another embodiment the processing module 240 may transcode the compressed data, that is first decode and then re-encode the A/V contents to any desired format, such as, AAC, MP2, MP3, AC-3, FLAC, WAV, MPEG1/2/4, H.263, H.264, or any other standard or proprietary format. The decoded, encoded, or re-encoded A/V contents are passed onto the output module 260.

In another embodiment, the USB apparatus 200 may share the contents of the internal storage 230 with an external device such as a portable media player. The input module 225 reads the internal storage 230 contents; the processing module 240 performs any transformation required on the data based on the type of external device 420 attached and passes the data to the output module 260.

The output module 260 transfers and stores the transformed A/V contents to the internal storage memory 230 or to the memory associated with the external device 420 attached via the USB interface 270. The external device 420 can be a portable media player in which case the A/V content stored is in playback ready form in format supported by the portable media player. The output module 260 may also transfer the compressed A/V contents to a general purpose storage device other than the portable media player. The output module 260 may employ any wired or wireless means under a suitable protocol or standard for data transfer.

The USB apparatus 200 includes a power module 255 which receives controls and provides the appropriate voltages to the USB apparatus 200 for its operation. In one embodiment, the power input to the power module 255 can be via the USB interface 270, such as through the USB cap 300 or an external USB power adapter.

The USB apparatus 200 further includes the user interface module 245. The user interface module 245 is configured to accept inputs from a user. The inputs from the user may be used to control the operation of the USB apparatus 200. The user interface 245 is also configured to indicate the status of the USB apparatus 200 for the benefit of the user and help in operating the USB apparatus 200 correctly.

The USB apparatus 200 further includes a configuration module 250. One function of the configuration module 250 is to enable each of the functionality of the multi-functional USB apparatus 200 in an automatic fashion. The configuration module 250 configures the processing module 240 for a particular functionality based on the status of the input module 225 and the output module 260 at any one particular time. The status of the input module 225 and the output module 260 in turn may depend on the connected state of the input A/V interface 220, USB interface 270, and output A/V interface 280 at any one particular time. For example, if the input module 225 receives its input from an audio source connected through the input A/V interface 220, the configuration module 250 configures the processing module 240 as an audio recorder. An additional function of the configuration module 250 can be to make the USB apparatus 200 operate differently from the default settings. For example, if by default the USB apparatus 200 compresses input video in H.264 format, information can be conveyed by the configuration module 250 to the processing module 240 to use a different compression engine, for example MPEG2. One mechanism for achieving this is to create a configuration file, using some form of a PC utility, with desired recording parameters and other settings and placing the file in the internal storage 230 and/or the external storage device 420. The USB apparatus 200 on finding this configuration file uses the settings in the file to function accordingly.

Figure 5A:
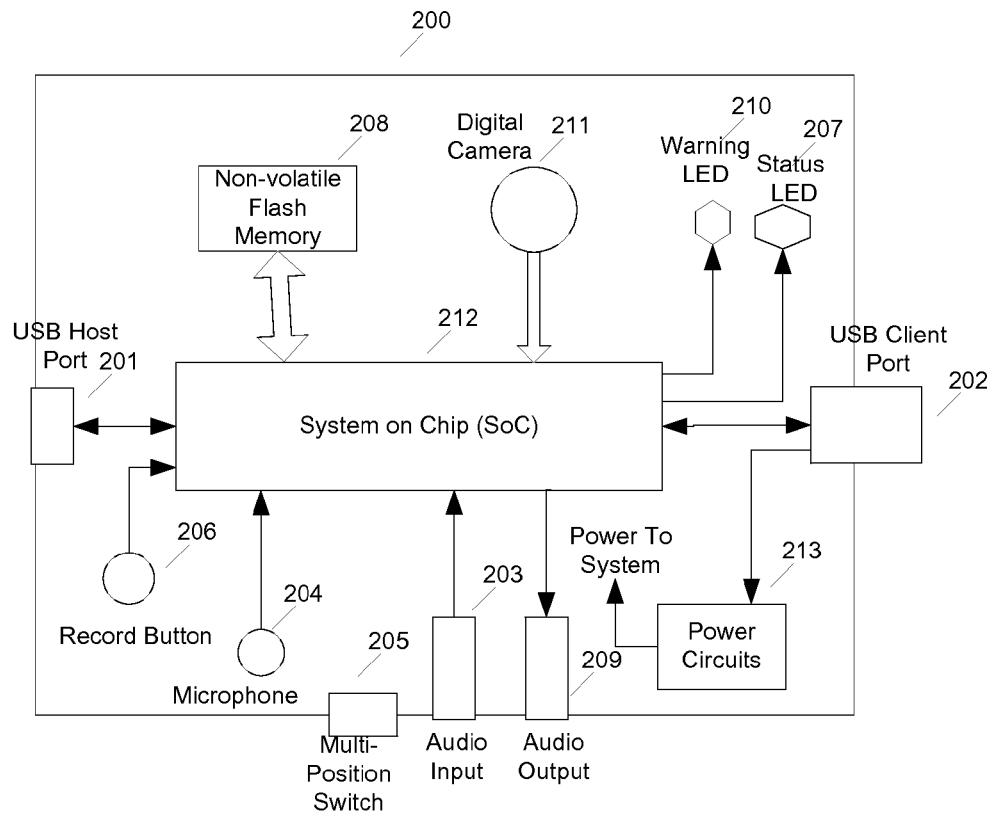
FIG. 5a is a component block diagram of the USB apparatus of the present invention.

FIG. 5a shows a component block diagram of one realization of the multi-function USB apparatus 200 shown in FIG. 4. The system-on-chip (SoC) component 212, shown in FIG. 5a, includes a programmable central processing unit (CPU) for computing, memory interface support for variety of memory types including volatile (system RAM) and non-volatile (flash memory), and a number of on-chip controllers and peripheral modules for input/output connectivity. The various on-chip modules include USB host and device controllers enabling the USB apparatus 200 to be a USB client as well as a USB host. External USB clients can connect to the USB apparatus 200 via the USB host port 201 and USB apparatus 200 can itself connect to a USB host, such as a PC via the USB client port 202. Other on-chip input/output module include A/D and D/A converters for allowing analog audio sources and sinks to connect through the input interface 203 and output interface 209 respectively. In one embodiment, the USB apparatus 200 includes on-board non-volatile flash memory 208 for local storage, an on-board microphone 204 and an on-board miniature video camera 211. The power module 213 is responsible for providing required voltages to the SoC and other electronic parts of the board for its operation. The input to the power module is through the USB port 201 via the USB cap 300 or an external USB power adapter.

The system-on-chip (SoC) 212 of FIG. 5a can be considered to correspond to the input A/V interface 220, input module 225, processing module 240, output module 260, configuration module 250, output module 260, and A/V output interface 280 of FIG. 4. The on-board microphone 204 and video camera 211 corresponds to module 235 of FIG. 4. The USB ports 201 and 202 correspond to the USB interface 270 of FIG. 4. The non-volatile flash memory 208 corresponds to internal storage memory 230 of FIG. 4. The recorder button 206 and multi-position switch 205 correspond to user interface module 245 of FIG. 4. The power module 213 corresponds to the power module 255 of FIG. 4.

Figure 5B:
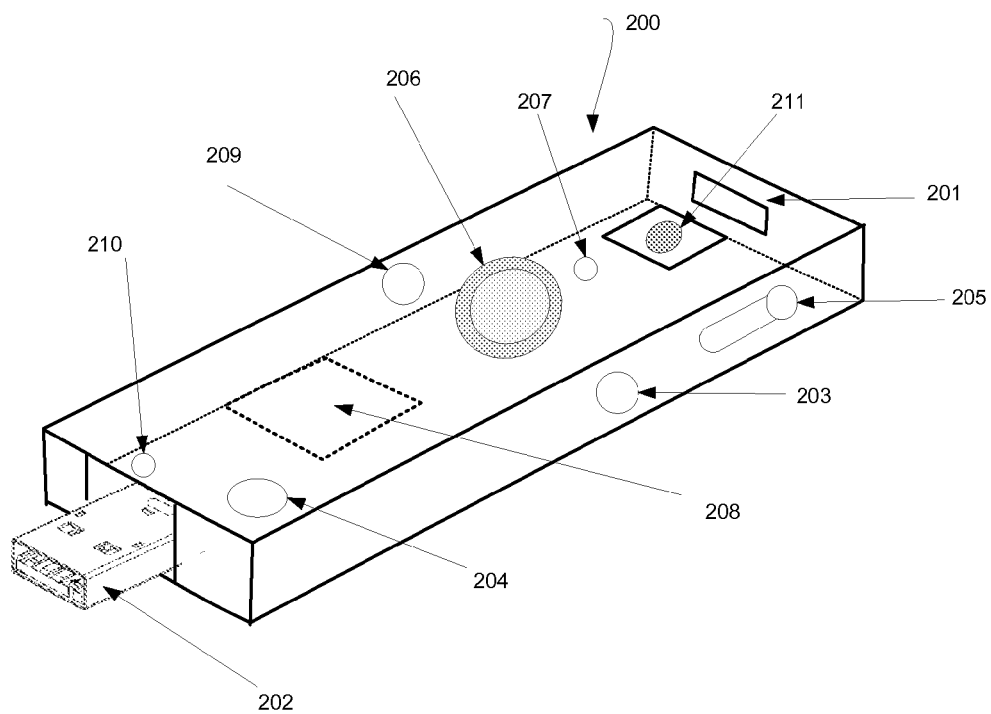
FIG. 5b is an isometric view of the USB apparatus of the present invention.

In one embodiment, the multi-function USB apparatus 200 of the invention of FIG. 5a, is realized in shape and proportion of a USB flash drive as shown in FIG. 5b. However, any other type of realization can be pursued that suits the end application.

As will be further described below, the USB apparatus 200, as shown in FIG. 5a and FIG. 5b, is used to facilitate providing a number of functions including, recording, monitoring, playing and transferring of audio and video data. The input source can be an external audio source connected via the audio input 203, on-board microphone 204 and/or digital video camera 211. The recordings can be stored onto a storage media, which can be the internal storage 208 built-in to the USB apparatus 200 (for example, flash memory) or directly to an external USB storage device attached to the USB apparatus 200 via the USB host port 201. The USB apparatus 200, as a USB client device, can be connected to a computer via the USB client port 202 to transfer data to/from the internal storage 208. The data contents in the storage 208 can also be transferred (synced) to a device attached to a USB apparatus 200 through the USB host port 201 (for example a USB based media player). The USB apparatus 200 can be configured to playback contents, read from the storage 208 or storage associated with an external device attached via USB host port 201. The interface facilitates listening to the audio input for monitoring while recording or for playback from the storage 208 via a headphone or speaker system connected to audio output 209.

The USB host port 201 is for attaching USB client devices such as iPhone, iPod, and external USB mass storage devices. The USB client port 202 has dual use. It is for connecting USB apparatus 200 as a client USB device to a USB host port of a computer or to receive power through the USB cap 300 for its operation. The USB apparatus 200 can also be powered from the wall socket by any USB power adapter using the USB client port 202 of USB apparatus 200.

The audio port 203 is for receiving stereo audio signal from external sources. The built-in microphone 204 is an internal audio input source. The multi-position switch 205 is for adjusting input recording level. The button 206 is used for starting and stopping the recording, syncing, and playback control. The status LED 207 indicates various states of the device during operation. More than one button and LED can be employed for control and indication. Alternatively, other control and indication mechanisms such as voice based, through a remote control, and display panel such as an LCD can also be used. The built-in storage 208 is of non-volatile variety such as nand flash memory. The headphone jack 209 is for attaching a headset or speaker set for playback and monitoring audio input. In another embodiment, a Bluetooth enabled headset is employed. The LED 210 indicates various warning conditions to the user. The warning indications include audio signal clipping occurrence, low storage space, and low battery voltage. The built-in camera 211 is for capturing pictures and recording video. The lens of the camera 211 is protected by a mechanical cover which can slide open to use the camera 211. Additionally, the camera lens is protected by a see through material, such as glass or clear plastic.

Figure 6:
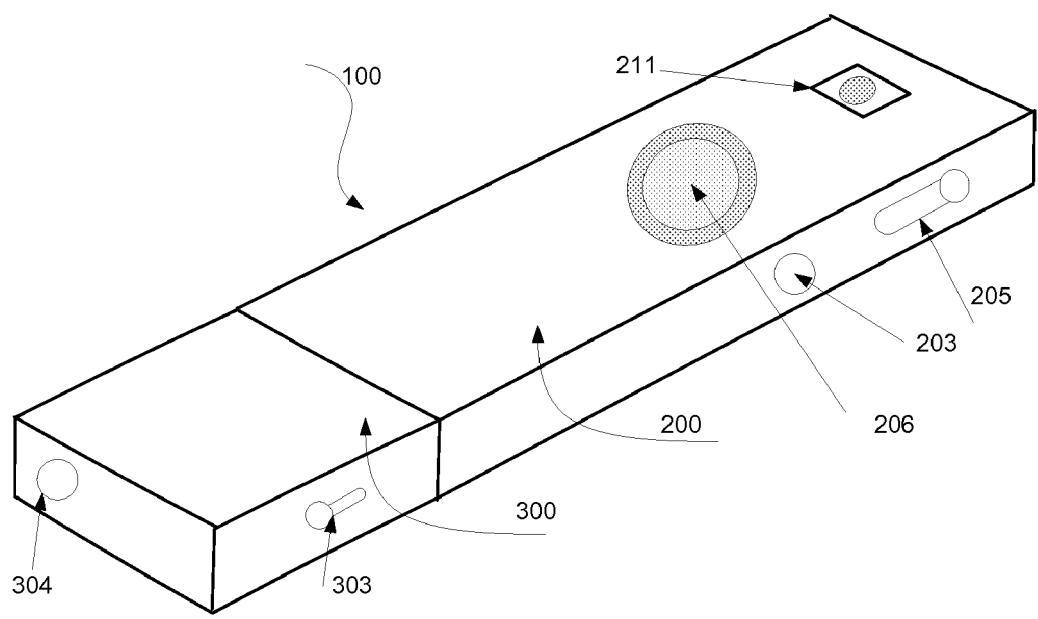
FIG. 6 is an isometric view of the USB system of the present invention.

FIG. 6 shows an isometric view of the USB system 100 of the invention with the USB apparatus 200 plugged into USB cap 300. The USB system 100 is powered by the USB cap 300 either through the battery or by an external DC power adapter via power jack 304. The multi-functional aspect of the USB system 100 is described next using FIG. 5 and FIG. 6.

In one embodiment the USB system 100 is a music/audio recorder. An audio signal can be recorded from multitude of analog sources including CD/DVD player, cassette/LP player, cable/satellite box, external microphone, and TV. Alternatively, input audio signal can be digital as well. An audio source is connected to audio port 203 using suitable cabling. The button 206 when pressed starts the recording and on pressing again stops it. The audio recording can also be monitored, while recording, through the headphone port interface 209.

The multi-position switch 205 provides for audio recording level adjustment to obtain desired recording volume. Since output signal level can differ from one audio source to another (e.g., from CD/DVD players, LP to cassette players), the multi-position switch 205 has several gain settings to compensate for the difference in signal level and obtain uniform level of recording volume irrespective of the source attached. In one embodiment the switch 205 has low, mid and high gain settings correspondingly. The headphone port 209 can be used to listen to the input signal level and select a switch position of the switch 205 that gives the desired recording volume. The LED 210 is also used for warning a user by blinking it red if audio clipping is detected at the input. Future advancements in warning systems are also contemplated.

The USB system 100 also captures and records audio from the built-in microphone 204, such as voice, when there is no external audio source connected to audio jack 203; shutter of the camera 211 is closed; and no external USB client device is attached to the USB host port 201. For voice-only recording, the apparatus can switch to low sample-rate and low bit-rate, supported by the audio compression engine being used. The recordings are stored in the internal storage 208. This mode can be used to record class lectures, memos, meetings, music practice sessions or any type of desired sound. Alternatively, in another embodiment of the apparatus that does not contain a shutter for the camera, it records audio from the built-in microphone 204 when there is no source attached to audio port 203; camera 211 is not in its operating mode; and no external USB client device is attached to the USB host port 201.

To take photographs or record an audio/video (A/V) segment, the built-in miniature video camera 211 can be used along with the built-in microphone 204 for the audio. The USB apparatus 200 contains a miniature video camera 211 with a mechanical cover that slides to open. When the cover is opened, the light activates a "light activated switch", placed near the camera 211. The light activated switch signals the USB system 100 to enter camera mode. When a user clicks the button 206, a snapshot is taken. When the user keeps the button 206 pressed for 2-3 seconds, A/V recording starts. The recording can be stopped by clicking the same button again.

The received audio and/or video signal is digitized if required, encoded and stored in the internal storage 208 if no USB client device is attached to the USB system 100. If a USB client device is detected, attached to the USB host port 201, recordings are stored directly to the external USB client device storage space. The USB client device can be a portable media player like iPod/iPhone, cell phone and numerous other MP3 players. While recording is in progress the battery of an attached media player also gets charged. The connected USB client device can also be a USB flash drive or a USB hard disk.

In yet another embodiment, when only a headphone is coupled with the jack 209, the USB system 100 becomes an audio player. The recordings stored in local storage 208, are automatically played back on pressing the button 206. However, if an external USB client device is also connected to USB host port 201, the system scans and plays songs from the external USB client device storage space instead of the local storage 208. While playing a track, the button 206 can be pressed to skip to the next song.

The compression/decompression (codec) engine is by default MP3 for audio-only signal, JPEG for images, and H.264 for video and AAC for audio for A/V recording. Different codecs including AAC, WAV or FLAC for audio, and MPEG 4/2/1, H.263 for video can be selected through a user defined configuration file, placed in the internal storage 208 or in the external storage of USB client device.

In another embodiment, the invention acts as a portable media kiosk. The USB system 100 goes into kiosk mode if it detects only a USB client device attached to USB port 201 with no other connections to it. On pressing the button 206, data in the internal storage 208 gets transferred automatically to the storage space of the attached USB client device. The USB system 100 carries out file management task as well during the transfer (syncing) process. This includes not copying a file if it already exists in the external USB device or not transferring if the external USB device memory is insufficient. The LED 210 warns the user, if an error occurs such as low storage space during the syncing process.

Referring to FIG. 5b, in yet another embodiment, USB apparatus 200, of the USB system 100, appears as a USB mass storage device when connected to a computer through its client USB port 202. The data contents can be moved between the device and computer by the customary cut/copy/paste or drag-and-drop operation. The USB apparatus 200 is powered by the computer is this case.

In yet another embodiment the USB apparatus 200, of the USB system 100, can record audio from the computer, when attached to it. This mode gets enabled if an audio source is connected to audio jack 203. The audio source can be the computer audio-out port itself, to record for example internet radio broadcasts. On pressing the button 206, the USB apparatus 200 no longer appears as a USB flash drive to the computer and recordings take place in the internal storage 208. As soon as recording is stopped, the USB apparatus 200 again appears as a USB flash drive and recorded contents can be transferred to the computer. The USB apparatus 200 is powered by the computer is this case. The recorded contents can also be transferred later to an external USB device using kiosk mode of the USB system 100.

In yet another embodiment of the invention the USB apparatus 200, of the USB system 100, is controlled through desktop software, installed on a host computer. The USB apparatus 200 is attached through its client port 202 to the host computer and also powered by it. The Desktop software detects the presence of the USB apparatus 200 and on selection, can enable a method for bi-directional real-time communication between the computer and USB 200. This method facilitates the USB apparatus 200 to send and receive the data to/from the host computer. In one scenario, the host computer receives digital audio data from USB apparatus 200, and stores it in local storage, plays it back, or streams it to remote network devices. In yet another scenario, the host computer receives audio data from its local storage, a network device or its audio input, and sends it to USB apparatus 200, for further processing such as encoding, encryption, storage, playback, or transfer to a portable media player using kiosk mode of the present invention. The various additional modes can be realized and controlled through a desktop utility on the host computer.

Figure 7:
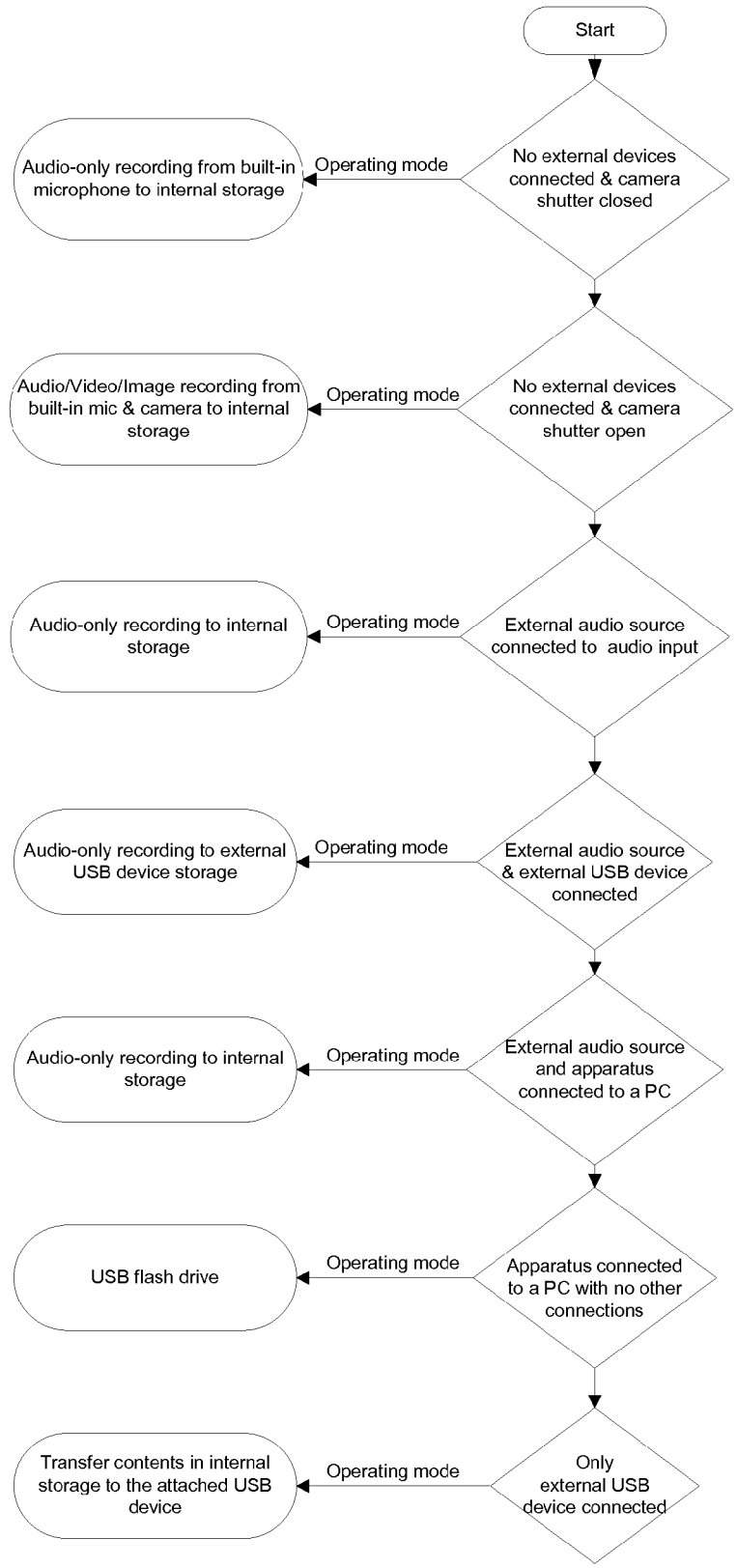
FIG. 7 is a flow chart showing auto-configuration of some of the operating modes of the USB system of the present invention, based on input/output connection at any one time.

In yet another embodiment of the invention, the USB system 100 configures itself automatically into a particular mode, based on the input/output interface connections at the time. No user settings are required. With no input-output devices connected to the USB system 100 and camera 211 cover closed, the USB system 100 records audio from the built-in microphone 204 and stores recording to the local storage. When the cover of miniature video camera 211 is slide opened, the USB system 100 goes into camera mode. When an audio source is attached to the audio input 203, the USB system 100 configures itself as an audio-only recorder. The recording takes place into the storage space of an external USB device if one is attached to the USB host port 201. Otherwise, recording is stored in the local storage 208 of the USB system 100. If only an external USB device is attached to the USB host port 201, the USB system 100 goes into media-kiosk mode. When only headphone jack 209 is connected, the USB system 100 becomes an audio player. The USB flash drive mode of USB system 100 is achieved by connecting the USB apparatus 200 to a computer's USB host port. If an audio source is connected to audio jack 203, while USB apparatus 200 is connected to a computer, it again goes into audio recorder mode. In this scenario, internet radio and similar broadcasts from the computer can be recorded into the local storage of the USB system 100. FIG. 7 shows some of the cases of the USB system 100 mode selections, in automatic fashion, based on input/output interface connection at any one time.

The advantages of the present invention include, without limitation, having a replaceable USB cap acting as a power source, multi-functionality in a single USB device, automatic mode configuration and kiosk mode. The kiosk mode enables sharing of files in an easy manner with friends and family. Another use of the kiosk mode of the invention or its variant is in museums, information centers, and other similar places whereby visitors can download the information to their favorite media player and listen to it while touring the place. The kiosk mode can also be used as a part of distribution system for any type of digital content, e.g., data files, media files.

An enhanced embodiment of the present invention is the realization of media streaming over wired or wireless networks such as Ethernet and WiFi, by adding appropriate interfaces and methods. In one arrangement the USB system 100 may receive streamed contents from local or remote stations on the network and store these in the internal storage 208 for processing. If the received contents are encrypted, appropriate decryption methods are applied. The contents can subsequently be transferred to an external USB device (e.g., portable media player, USB flash drive) using the kiosk mode of the present invention or played back on the USB system itself.

In broad embodiment, the USB cap of the present invention can be designed for all types of USB devices needing power to function. In broad embodiment, the shape and size of USB apparatus 200 can be any suitable structure including that of a small set-top-box. Appropriate USB cables can be used for connecting to a computer and a USB power adapter for powering in stand-alone mode.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein.

The modules and methods described in connection with the embodiments disclosed herein may be embodied directly in hardware, in a software module executable by a processor, or in a combination of both, in the form of control logic, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

When referring to the invention, coupling one element to another element could be through various means. One such means includes directly connecting both elements. Another such means includes using an intermediary device or element as a coupling to couple both the elements.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

We claim:

1. A multi-functional Universal Serial Bus (USB) system comprising:
   a first USB apparatus exhibiting multi-functionality, having a USB host port, a USB client port, audio/video (A/V) input and output interfaces, a memory module, electronic circuitry; and a processing engine controlling and managing the USB host port for data storage and transfer to external USB client devices, USB client port for data exchange with a computer and as a power receptacle, A/V input/output, memory module for internal data storage, and electronic circuitry of the USB apparatus;
   a second USB apparatus having the form of a USB cap housing a battery module and a USB host port connector and functioning as a power source; wherein power is provided by the USB cap through its USB host connector pins by coupling both structurally and electrically with the first USB apparatus through its USB client port; and
   wherein the USB cap continuously monitors the level of output voltage of the rechargeable battery and indicates a low voltage warning and signals the low voltage warning to the first USB apparatus, when the battery voltage falls below a predetermined threshold.

2. The multi-functional USB system of claim 1, wherein the multi-functional USB apparatus further comprising a plurality of operating modes, wherein each mode configures the USB apparatus to operate in a specific manner, demonstrating its multi-functionality.

3. The multi-functional USB system of claim 2, wherein the internal memory module or an external USB storage device or a computer is capable of storing and reading digital files that are imported and exported into the USB system through one of the plurality of operating modes of the USB apparatus.

4. The multi-functional USB system of claim 2, wherein the operating mode is a camera mode to capture still images or record a video clip.

5. The multi-functional USB system of claim 2, wherein the operating mode is an audio recording mode that allows the recording of audio files.

6. The multi-functional USB system of claim 5, wherein the audio recording mode allows recording from a microphone that is housed in the USB apparatus or from an A/V source that is external to the USB apparatus.

7. The multi-functional USB system of claim 5, wherein the audio recording mode allows recording of audio files to the memory module of the USB apparatus or to a storage device that is external to the USB apparatus.

8. The multi-functional USB system of claim 2, wherein the operating mode is an audio playing mode, that allows playing of audio files from the memory module of the USB apparatus or from a storage device that is external to the USB apparatus.

9. The multi-functional USB system of claim 2, wherein the operating mode is a USB flash drive mode, wherein USB client port of the USB apparatus is used for connecting to a USB host port of a computer for data exchange.

10. The multi-functional USB system of claim 2, wherein the operating mode is a media sharing mode that allows sharing of media files that are stored in the memory module of the USB apparatus with an external storage device that is coupled to the USB apparatus through its USB host port, without the need to use a computer to act as an intermediary for sharing and transferring the files.

11. The multi-functional USB system of claim 1, wherein when the USB cap is coupled to the USB apparatus, the battery module of the USB cap is used for providing power to the processing engine, memory module, and electronic circuitry of the USB apparatus.

12. The multi-functional USB system of claim 1, wherein the USB system includes a plurality of USB caps having a battery module, whereby a USB cap having a discharged battery module can be replaced with a USB cap having a fully charged battery module to increase operating time of the USB system.

13. The multi-functional USB system of claim 1, wherein the processing engine, memory module, and electronic circuitry of the USB apparatus can function independently and separately from the USB cap by receiving power from a source that is external to the USB system.

14. The multi-functional USB system of claim 1, wherein the USB cap can be a power source for downstream USB devices other then the USB apparatus, wherein USB devices are equipped with a USB client port, similar to the USB apparatus; and
wherein the battery housed in battery module of the USB cap can be recharged by attaching an external DC power adapter to the USB cap, while it simultaneously provides power to the USB apparatus or any other USB device, attached to the USB cap, for their operation.

15. The multi-functional USB system of claim 1, wherein the battery module of the USB cap includes a power management circuit board, wherein the power management circuit board includes power management circuitry that controls various features of the battery module including the charging of a rechargeable battery that is housed within the battery module.

16. The multi-functional USB system of claim 15, wherein the power management circuitry may includes a voltage boost regulator to boost and regulate the output voltage of the rechargeable battery to the required voltage for the operation of USB devices connected to the USB host port of the USB system.

17. The multi-functional USB system of claim 15, wherein the power management circuitry includes a low voltage detector and a control circuit, wherein the low voltage detector and control circuit work together to continuously monitor the level of output voltage of the rechargeable battery to indicate a low voltage warning and signal the low voltage warning to the USB apparatus, if the battery voltage falls below a predetermined threshold.

18. The multi-functional USB system of claim 15, wherein the power management circuitry includes a low voltage detector and a cut-off switch, wherein the low voltage detector and cut-off switch work together to cut off power when a low battery voltage is detected.

19. The multi-functional USB system of claim 15, wherein the power management circuitry includes battery bypass circuitry, wherein when a DC power source is coupled to the USB system with the USB apparatus and the USB cap in its coupled position, the battery bypass circuitry activates and allows the power from the DC power source to provide power to the USB apparatus while also recharging the rechargeable battery housed in the USB cap.

20. The multi-functional USB system of claim 1, wherein the USB cap is detachable from the USB apparatus.

21. A method of providing power using a Universal Serial Bus (USB) comprising:
a USB system that has a USB apparatus and a USB cap, wherein the USB cap includes a battery module and a USB host port connector, wherein the USB apparatus includes a USB client port, a USB host port, audio/video (A/V) input and output interfaces, a memory module for data storage, electronic circuitry; and a processing engine controlling and managing the USB host port, USB client port, A/V input/output, memory module, and electronic circuitry of the USB apparatus, wherein the USB cap is coupled both electronically and structurally to the USB apparatus;
wherein the USB cap continuously monitors the level of output voltage of the rechargeable battery and indicates a low voltage warning and signals the low voltage warning to the USB apparatus, when the battery voltage falls below a predetermined threshold;
operating the USB cap when it is in a decoupled position from the USB apparatus; and
activating the battery module of the USB cap, wherein the battery module includes a rechargeable battery and power management circuit board to provide power to an external USB device that is equipped with a USB client port similar to the USB apparatus.

22. The method of claim 21, wherein activating the battery module comprises electronically coupling the USB cap to an external USB device and allowing appropriate voltage from the USB cap through its USB host connector power pins to reach the external USB device equipped with a USB client port, for providing power to the external USB device.

23. The method of claim 21, wherein the USB cap receives DC power from an external DC power source for charging the rechargeable battery of the battery module and providing power, with or without the external DC power source, to external devices that are equipped with a USB client port similar to the USB apparatus.

24. A method of auto-configuring a Universal Serial Bus (USB) system comprising:
a USB system that has a USB apparatus and a USB cap, wherein the USB cap includes a battery module and a USB host port, wherein the USB apparatus includes a processing module, a memory module for internal storage, a plurality of input/output interface connection, a USB host port, and a USB client port, wherein the USB cap is coupled both electronically and structurally to the USB apparatus;
wherein the USB cap continuously monitors the level of output voltage of the rechargeable battery and indicates a low voltage warning and signals the low voltage warning to the USB apparatus, when the battery voltage falls below a predetermined threshold;
detecting a presence or absence of coupling of external devices to the USB system through its plurality of input/output interface connections; and
auto-configuring the USB system to operate in a specific mode that correlates to the presence or absence of external devices coupled to the USB system through any one of the plurality of its input/output interface connections.

25. The method of auto-configuring the USB system of claim 24, wherein auto-configuring the USB system to a voice-record mode when no external devices are coupled to the USB system and a built-in video/camera module is not activated, wherein the USB system in its voice-record mode allows recording of audio from the built-in microphone.

26. The method of auto-configuring the USB system of claim 24, wherein auto-configuring the USB system to a camera mode when no external audio input source is coupled to the USB system and a built-in video/camera module is activated, wherein the USB system in its camera mode allows recording of still and motion pictures from the built-in video camera with audio input from the built-in microphone.

27. The method of auto-configuring the USB system of claim 24, wherein auto-configuring the USB system to an audio-record mode when an external audio input source is coupled to the USB system and a built-in video/camera module is not activated, wherein the USB system in its audio-record mode allows recording of audio signal from the external audio input source.

28. The method of auto-configuring the USB system of claim 24, wherein auto-configuring the USB system to an audio-record mode, wherein the recording is to an external storage device if the external storage device is connected to the USB host port of the USB system, otherwise the recording is to the memory module for internal storage.

29. The method of auto-configuring the USB system of claim 24, wherein auto-configuring the USB system to an audio-record mode, wherein the input audio being recorded can also be monitored by coupling a headphone or speaker to the USB system through its audio output interface connection.

30. The method of auto-configuring the USB system of claim 24, wherein auto-configuring the USB system to an audio-play mode when a headphone or speaker is coupled to the USB system, no external audio input source is coupled to the USB system, and a built-in video/camera module is not activated, wherein the USB system in its audio-play mode allows playing of audio files.

31. The method of auto-configuring the USB system of claim 30, wherein the playing of audio files is from an external storage device if it is connected to the USB host port of the USB system, otherwise from the internal storage of the memory module of the USB system.

32. The method of auto-configuring the USB system of claim 24, wherein auto-configuring the USB system to a media-kiosk mode when an external storage device is coupled to the USB system through its USB host port, wherein the USB system in its media-kiosk mode allows transfer of media files from the internal storage of the memory module of the USB system to an external storage device enabling instant sharing of media contents.

33. The method of auto-configuring the USB system of claim 24, further comprising providing a switch that can be activated, wherein activating the switch allows start/stop of record, play or transfer operation of the USB system respectively.

34. The method of auto-configuring the USB system of claim 24, wherein auto-configuring the USB system to a USB flash drive mode when the USB apparatus is coupled to a computer through its USB client port, wherein the USB system in its USB flash drive mode allows storage and transfer of digital files into and out of the memory module.

* * * * *